US012812919B2

(12) United States Patent
Seol et al.

(10) Patent No.: US 12,812,919 B2
(45) Date of Patent: Nov. 24, 2026

(54) SEMICONDUCTOR DEVICE INCLUDING MULTI-LAYER GATE INSULATING LAYER AND ELECTRONIC DEVICE INCLUDING THE SAME

(71) Applicant: Samsung Electronics Co., Ltd., Suwon-si (KR)

(72) Inventors: Minsu Seol, Suwon-si (KR); Sungil Park, Suwon-si (KR); Jaehyun Park, Suwon-si (KR); Kyung-Eun Byun, Suwon-si (KR); Eunkyu Lee, Suwon-si (KR); Junyoung Kwon, Suwon-si (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 366 days.

(21) Appl. No.: 18/518,729

(22) Filed: Nov. 24, 2023

(65) Prior Publication Data

US 2024/0178307 A1 May 30, 2024

(30) Foreign Application Priority Data

Nov. 25, 2022 (KR) ........................ 10-2022-0160792

(51) Int. Cl.
*H10D 48/36* (2025.01)
*H10D 30/69* (2025.01)
*H10D 62/80* (2025.01)

(52) U.S. Cl.
CPC ......... *H10D 48/362* (2025.01); *H10D 30/701* (2025.01); *H10D 62/80* (2025.01)

(58) Field of Classification Search
CPC .... H10D 48/362; H10D 30/701; H10D 62/80; H10D 30/481; H10D 64/033;
(Continued)

(56) References Cited

U.S. PATENT DOCUMENTS 7,968,674 B2 6/2011 Choi et al.
7,988,941 B2 8/2011 Choi et al.
(Continued)

FOREIGN PATENT DOCUMENTS

KR 10-2012-0137053 A 12/2012
KR 10-2021-0052162 A 5/2021
(Continued)

OTHER PUBLICATIONS

Nan Ma et al., 'Charge Scattering and Mobility in Atomically Thin Semiconductors' *Physical Review X*, vol. 4, 2014, pp. 011043-1-011043-9.

(Continued)

*Primary Examiner* — Jonathan Han
(74) *Attorney, Agent, or Firm* — Harness, Dickey & Pierce, P.L.C.

(57) ABSTRACT

A semiconductor device may include a multi-layer gate dielectric layer and an electronic apparatus including the semiconductor device. The semiconductor device may include a channel layer including a two-dimensional semiconductor material, a gate dielectric layer on a first area of the channel layer, a gate electrode on the gate dielectric layer, and source and drain electrodes in a second area of the channel layer. The gate dielectric layer may include a high-k dielectric layer and an intermediate dielectric layer. The intermediate dielectric layer may be between the high-k dielectric layer and the channel layer. A dielectric constant of the intermediate dielectric layer may be less than a dielectric constant of the high-k dielectric layer.

16 Claims, 14 Drawing Sheets

(58) Field of Classification Search
CPC .. H10D 64/685; H10D 64/689; H10D 62/882; H10D 30/6739; H10D 30/6704; H10D 30/6757
See application file for complete search history.

(56) References Cited

U.S. PATENT DOCUMENTS

| | | | |
|---|---|---|---|
| 8,133,466 | B2 | 3/2012 | Shin et al. |
| 8,283,038 | B2 | 10/2012 | Choi et al. |
| 8,535,553 | B2 | 9/2013 | Kong et al. |
| 8,623,761 | B2 | 1/2014 | Bonilla et al. |
| 8,723,024 | B2 | 5/2014 | Choi et al. |
| 8,895,433 | B2 | 11/2014 | Bonilla et al. |
| 8,906,787 | B2 | 12/2014 | Park et al. |
| 8,912,530 | B2 | 12/2014 | Yang et al. |
| 9,040,957 | B2 | 5/2015 | Lee et al. |
| 9,056,424 | B2 | 6/2015 | Wenxu et al. |
| 9,064,777 | B2 | 6/2015 | Heo et al. |
| 9,108,848 | B2 | 8/2015 | Woo et al. |
| 9,324,634 | B2 | 4/2016 | Bao et al. |
| 9,324,635 | B2 | 4/2016 | Bao et al. |
| 9,359,211 | B2 | 6/2016 | Woo et al. |
| 9,472,450 | B2 | 10/2016 | Bonilla et al. |
| 9,527,043 | B2 | 12/2016 | Choi et al. |
| 9,533,265 | B2 | 1/2017 | Choi et al. |
| 9,583,358 | B2 | 2/2017 | Kim et al. |
| 9,721,734 | B2 | 8/2017 | Ryu et al. |
| 10,325,987 | B2 | 6/2019 | Park et al. |
| 11,158,807 | B2 | 10/2021 | Vasen et al. |
| 2009/0101892 | A1* | 4/2009 | Dimitrakopoulos ........................ H10K 71/191 257/E21.52 |
| 2011/0127471 | A1 | 6/2011 | Shin et al. |
| 2012/0313079 | A1 | 12/2012 | Song et al. |
| 2013/0059155 | A1 | 3/2013 | Choi et al. |
| 2014/0087191 | A1 | 3/2014 | Chua et al. |
| 2015/0235959 | A1 | 8/2015 | Lee et al. |
| 2016/0141427 | A1 | 5/2016 | Chen et al. |
| 2018/0240804 | A1* | 8/2018 | Yoo ........................ H10B 51/30 |
| 2021/0119131 | A1* | 4/2021 | Vasen .................. H10K 10/472 |
| 2021/0123161 | A1 | 4/2021 | Lee et al. |
| 2021/0234015 | A1 | 7/2021 | Lee et al. |
| 2021/0296445 | A1 | 9/2021 | Lee et al. |
| 2021/0376134 | A1 | 12/2021 | Chen et al. |
| 2022/0045176 | A1 | 2/2022 | Sathaiya et al. |
| 2022/0059702 | A1 | 2/2022 | Naylor et al. |
| 2022/0077321 | A1 | 3/2022 | Seol et al. |
| 2023/0104966 | A1* | 4/2023 | Su ..................... H01J 37/32449 427/569 |

FOREIGN PATENT DOCUMENTS

| | | | |
|---|---|---|---|
| KR | 2021/0095459 | A | 8/2021 |
| KR | 2021/0117004 | A | 9/2021 |
| KR | 2022/0031366 | A | 3/2022 |
| WO | WO-2018/009931 | A1 | 1/2018 |

OTHER PUBLICATIONS

Korean Office Action dated May 12, 2026 issued in corresponding Korean Patent Appln. No. 10-2022-0160792 (with English translation).

* cited by examiner

SEMICONDUCTOR DEVICE INCLUDING MULTI-LAYER GATE INSULATING LAYER AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2022-0160792, filed on Nov. 25, 2022, in the Korean Intellectual Property Office, the disclosure of which is incorporated by reference herein in its entirety.

BACKGROUND

1. Field

The disclosure relates to a semiconductor device including a multi-layer gate dielectric layer and an electronic apparatus including the semiconductor device.

2. Description of the Related Art

A transistor is a semiconductor device performing electrical switching, and is widely used in various semiconductor products such as a memory, a driving integrated circuit (IC), etc. When the size of a semiconductor device is reduced, the number of semiconductor devices that may be integrated in one wafer increases and a driving speed of the semiconductor device also increases. Thus, research on reducing the size of semiconductor devices has been actively conducted.

Recently, research on using two-dimensional (2D) materials has been conducted to reduce the size of semiconductor devices. A 2D material is stabilized and has excellent characteristics even with a thickness of 1 nm or less, and thus, has been highlighted as a material for overcoming limitations of performance degradation caused due to the reduction in the size of semiconductor devices.

A transistor structure used in semiconductor devices has developed from a sheet-type to a gate all around (GAA) structure through a fin field effect transistor (FINFET) structure. A multi-bridge channels (MBC)-FET that is a type of GAA structure that has just been introduced copes with degradation due to a short channel effect according to an increase in integration of semiconductor devices, through a structure in which plate-type thin channels are vertically stacked.

SUMMARY

Provided is a semiconductor device including a multi-layer gate dielectric layer and an electronic apparatus including the semiconductor device.

Additional aspects will be set forth in part in the description which follows and, in part, will be apparent from the description, or may be learned by practice of the presented embodiments of the disclosure.

According to an embodiment, a semiconductor device may include a channel layer including a two-dimensional (2D) semiconductor material, a gate dielectric layer on a first area of the channel layer, a gate electrode on the gate dielectric layer, and a source electrode and a drain electrode in a second area of the channel layer. The gate dielectric layer may include a high-k dielectric layer and an intermediate dielectric layer. The intermediate dielectric layer may be between the high-k dielectric layer and the channel layer. A dielectric constant of the intermediate layer may be less than a dielectric constant of the high-k dielectric layer.

In some embodiments, the intermediate dielectric layer may include a material having a dielectric constant of 9 or less.

In some embodiments, a thickness of the intermediate dielectric layer may be about 0.5 nm to about 2 nm.

In some embodiments, the intermediate dielectric layer may include at least one of C, Si, B, N, O, and Al.

In some embodiments, the intermediate dielectric layer may include a crystalline material.

In some embodiments, the intermediate dielectric layer may include grains having smaller sizes than grains of the 2D semiconductor material of the channel layer.

In some embodiments, the intermediate dielectric layer may include a crystalline material having a grain size of 50 nm or less.

In some embodiments, the intermediate dielectric layer may include an amorphous material.

In some embodiments, the intermediate dielectric layer may include a 2D material.

In some embodiments, the 2D semiconductor material of the channel layer may include one to ten layers.

In some embodiments, the 2D semiconductor material of the channel layer may include one to five layers.

In some embodiments, the 2D semiconductor material of the channel layer may have a material having a band-gap of about 0.1 eV to about 3.0 eV.

In some embodiments, the 2D semiconductor material may include transition metal dichalcogenide (TMD), black phosphorous, or graphene.

In some embodiments, the TMD may include a metal element and a chalcogen element. The metal element may include one of Mo, W, Nb, Sn, V, Ta, Ti, Zr, Hf, Tc, and Re, and the chalcogen element may include one of S, Se, and Te.

In some embodiments, the TMD may include at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

In some embodiments, the semiconductor device may further include a ferroelectric layer between the high-k dielectric layer and the intermediate dielectric layer.

In some embodiments, the ferroelectric layer may include at least one of an oxide ferroelectric material, a polymer ferroelectric material, and a fluoride ferroelectric material.

In some embodiments, the gate electrode may include metal, conductive nitride, or conductive oxide.

In some embodiments, the source electrode and the drain electrode may include a metal material.

According to an embodiment, an electronic apparatus includes any one of the above-described semiconductor devices.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
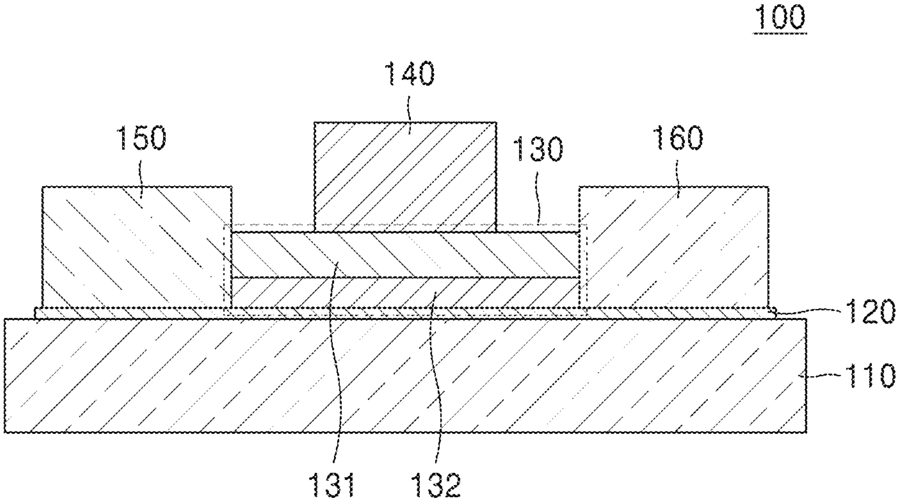
FIG. 1 is a cross-sectional view of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, one or more embodiments of the present disclosure will be described in detail with reference to accompanying drawings. In the drawings, like reference numerals denote like components, and sizes of components in the drawings may be exaggerated for convenience of explanation. The embodiments of the disclosure are capable of various modifications and may be embodied in many different forms.

When a layer, a film, a region, or a panel is referred to as being "on" another element, it may be directly on/under/at left/right sides of the other layer or substrate, or intervening layers may also be present. An expression used in the singular encompasses the expression of the plural, unless it has a clearly different meaning in the context. It will be further understood that when a portion is referred to as "comprising" another component, the portion may not exclude another component but may further comprise another component unless the context states otherwise.

The use of the term of "the above-described" and similar indicative terms may correspond to both the singular forms and the plural forms. Also, the steps of all methods described herein may be performed in any suitable order unless otherwise indicated herein or otherwise clearly contradicted by context.

Also, the terms " . . . unit", " . . . module" used herein specify a unit for processing at least one function or operation, and this may be implemented with hardware or software or a combination of hardware and software.

Furthermore, the connecting lines or connectors shown in the drawings are intended to represent example functional relationships and/or physical or logical couplings between the various elements. It should be noted that many alternative or additional functional relationships, physical connections, or logical connections may be present in a practical device.

The use of any and all examples, or example language provided herein, is intended merely to better illuminate the disclosure and does not pose a limitation on the scope of the present disclosure unless otherwise claimed.

FIG. 1 is a cross-sectional view of a semiconductor device 100 according to an embodiment.

The semiconductor device 100 of FIG. 1 may include, for example, a field effect transistor (FET).

Referring to FIG. 1, a channel layer 120 is disposed on a substrate 110, and a first area (not shown) including a gate electrode 140 and a gate dielectric layer 130 and a second area (not shown) including a source electrode 150 and a drain electrode 160 may be disposed on the channel layer 120. The gate dielectric layer 130 may include an intermediate dielectric layer 132 and a high-k dielectric layer 131. However, one or more embodiments are not limited thereto, and the semiconductor device will be described below in detail.

Referring to FIG. 1, the channel layer 120 is provided on the substrate 110. The substrate 110 may include insulating substrates of various materials. Also, the substrate 110 may further include, for example, an impurity area obtained through doping, an electronic apparatus such as a transistor, or a periphery circuit for selecting and controlling memory cells storing data.

The channel layer 120 according to the embodiment may include a two-dimensional (2D) semiconductor material. The 2D semiconductor material denotes a semiconductor material having a layered-structure in which element atoms are two-dimensionally bonded. The 2D semiconductor material has excellent electrical properties, and thus, characteristics thereof are not largely changed and high mobility of electrons may be maintained even when a thickness is reduced to a nano-scale.

The 2D semiconductor material may have a material having a band-gap of about 0.1 eV to about 3.0 eV. However, one or more embodiments are not limited thereto. The 2D semiconductor material may include, for example, transition metal dichalcogenide (TMD), black phosphorous, or graphene. However, one or more embodiments are not limited to the above example.

TMD is a compound of a transition metal and a chalcogen element. Here, the transition metal may include, for example, at least one selected from Mo, W, Nb, Sn, V, Ta, Ti, Zr, Hf, Tc, and Re, and the chalcogen element may include, for example, at least one selected from S, Se, and Te. In detail, the chalcogen element may include at least one selected from $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$. However, one or more embodiments are not limited to the above example.

The black phosphorous denotes a 2D material having a structure in which phosphor elements are two-dimensionally bonded. The graphene denotes a 2D material having a structure in which carbon (C) elements are two-dimensionally bonded.

The 2D semiconductor material forming the channel layer 120 may have a monolayer or a multilayer structure, and each layer may have a thickness in an atomic level. For example, the 2D semiconductor material may include one to ten layers. In more detail, for example, the 2D semiconductor material may include one to five layers. However, one or more embodiments are not limited thereto.

The channel layer 120 may include a certain dopant in order to adjust a mobility of the 2D semiconductor material. In detail, the 2D semiconductor material may be doped with a p-type dopant or an n-type dopant. The p-type dopant or the n-type dopant may be doped using an ion implantation or chemical doping method. However, one or more embodiments are not limited thereto.

A source of the p-type dopant may include, for example, ionic liquid such as $NO_2BF_4$, $NOBF_4$, $NO_2SbF_6$, etc., acidic compound such as HCl, $H_2PO_4$, $CH_3COOH$, $H_2SO_4$, $HNO_3$, etc., an organic compound such as dichlorodicyanoquinone (DDQ), oxone, dimyristoylphosphatidylinositol (DMPI), trifluoromethanesulfoneimide, etc. Alternatively, the source of the p-type dopant may include $HPtCl_4$, $AuCl_3$, $HAuCl_4$, silver trifluoromethanesulfonate (AgOTf), $AgNO_3$, $H_2PdCl_6$, $Pd(OAc)_2$, $Cu(CN)_2$, etc.

A source of the n-type dopant may include, for example, a reduction product of a substituted or unsubstituted nicotinamide, a reduction product of a compound which is chemically bound to a substituted or unsubstituted nicotinamide, and a compound comprising at least two pyridinium moieties in which a nitrogen atom of at least one of the pyridinium moieties is reduced. For example, the source of the n-type dopant may include nicotinamide mononucleotide-H (NMNH), nicotinamide adenine dinucleotide-H (NADH), nicotinamide adenine dinucleotide phosphate-H (NADPH), or viologen. Alternatively, the source of the n-type dopant may include a polymer such as polyethylenimine (PEI), etc. Alternatively, the n-type dopant may include an alkali metal such as K, Li, etc. In addition, the p-type dopant and the n-type dopant materials mentioned above are examples, and the other various materials may be used as the dopant.

The gate dielectric layer 130 is provided in the first area of the channel layer 120, such as on the first area of the channel layer 120, and a gate electrode 140 is provided on the gate dielectric layer 130. The gate dielectric layer 130 may include, for example, silicon nitride, etc., but is not limited thereto. The gate electrode 140 may include metal, conductive nitride, or conductive oxide. Here, the metal may include, for example, at least one from Au, Ti, W, Mo, Pt, and Ni. The conductive nitride may include, for example, TiN, TaN, WN, etc., and the conductive oxide may include, for example, indium tin oxide (ITO), indium zinc oxide (IZO), etc. However, one or more embodiments are not limited to the above examples.

The source electrode and the drain electrode may be provided in the second area of the channel layer 120, such as one the second area of the channel layer 120. The source electrode and the drain electrode may include, but are not limited to, a metal material.

The gate dielectric layer 130 may include the high-k dielectric layer 131 and the intermediate dielectric layer 132. The intermediate dielectric layer 132 denotes a dielectric layer that is provided between the high-k dielectric layer 131 and the channel layer 120 and has a less dielectric constant than that of the high-k dielectric layer 131.

According to the semiconductor device according to the related art, there is an issue of reducing or deteriorating a mobility of a channel layer due to occurrence of a remote phonon scattering effect although a capacitance of the gate dielectric layer increases as a dielectric constant of a material included in the gate dielectric layer increases. On the contrary, as the dielectric constant of the material included in the gate dielectric layer decreases, the remote phonon scattering effect is reduced, but a gate capacitance degrades and the channel mobility may also decrease. To address the above issue, an intermediate dielectric layer having a relatively small dielectric constant is inserted in the high-k dielectric layer, thereby reducing the remote phonon scattering effect and the channel mobility degradation. This will be described in detail later.

The intermediate dielectric layer 132 may be disposed between the channel layer 120 including the 2D semiconductor material and the high-k dielectric layer 131 may include a material having a dielectric constant of 9 or less. In contrast, the high-k dielectric layer 131 may include a material having a dielectric constant greater than 9.

The thickness of the intermediate dielectric layer 132 may be about 0.5 nm to about 2 nm. The thickness of the intermediate dielectric layer 132 may be less than that of the high-k dielectric layer 131. However, one or more embodiments are not limited thereto.

Because the thickness of the intermediate dielectric layer 132 is less than that of the high-k dielectric layer 131, the remote phonon scattering effect or a charged impurity scattering effect may be lessened, and accordingly, the mobility of the channel layer may be improved.

The intermediate dielectric layer 132 may include at least one selected from C, Si, B, N, O, and Al. However, one or more embodiments are not limited thereto.

Figure 2:
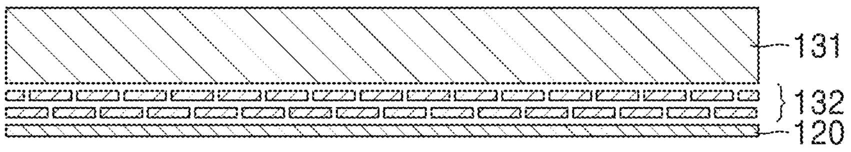
FIG. 2 is a diagram showing sizes of crystal grains in an intermediate dielectric layer and a channel layer included in the semiconductor device according to the embodiment of FIG. 1.

FIG. 2 is a diagram showing sizes of crystal grains in the intermediate dielectric layer 132 and the channel layer 120 included in the semiconductor device according to the embodiment of FIG. 1.

The intermediate dielectric layer 132 may include a crystalline material. The crystalline material denotes a structure having grains, and each grain may have a grain size.

The intermediate dielectric layer 132 may include a 2D material, and the 2D material may include a 2D semiconductor material. The 2D semiconductor material may include, for example, TMD, black phosphorous, or graphene. However, one or more embodiments are not limited to the above example. However, one or more embodiments are not limited thereto.

The 2D semiconductor material of the channel layer 120 may have grains, and the 2D material of the intermediate dielectric layer 132 may include grains having a grain size less than the 2D semiconductor material of the channel layer 120. In detail, the 2D material of the intermediate dielectric layer 132 may include a crystalline material having a grain size of 50 nm or less.

When the 2D material of the intermediate dielectric layer 132 has the grains having a smaller grain size than that of the 2D semiconductor material of the channel layer 120, a surface roughness scattering effect may be lessened, and uniform deposition of the high-k dielectric layer 131 disposed on the intermediate dielectric layer 132 may be easily carried out. When the high-k dielectric layer 131 is uniformly deposited, the channel mobility may be improved and leakage current from the gate may be limited and/or prevented.

In some embodiments, the intermediate dielectric layer 132 may include one or more low-k materials. The intermediate dielectric layer 132 may include $SiO_2$ or SiNx. The intermediate dielectric layer 132 may include one or more 2D low-k materials, such as h-BN and a-BN.

Figure 3A:
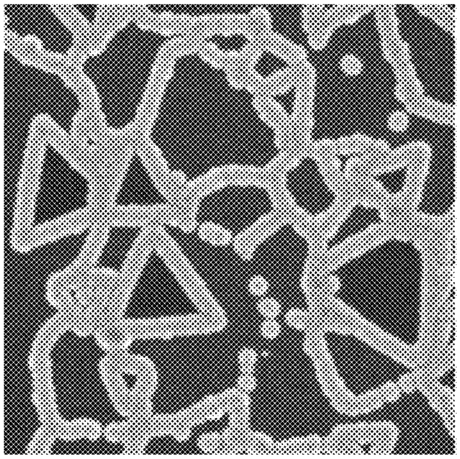
FIGS. 3A to 3C are diagrams illustrating deposition of a high-k dielectric layer according to sizes of crystal grains.
Figure 3B:
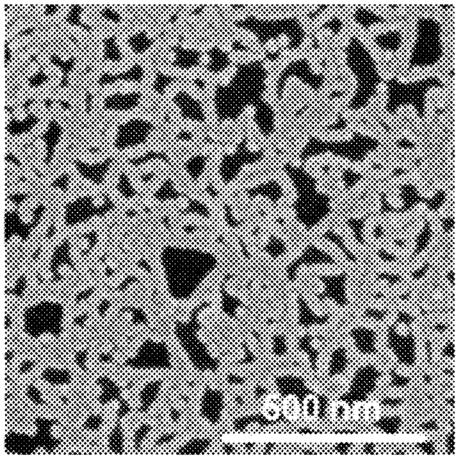
Figure 3C:
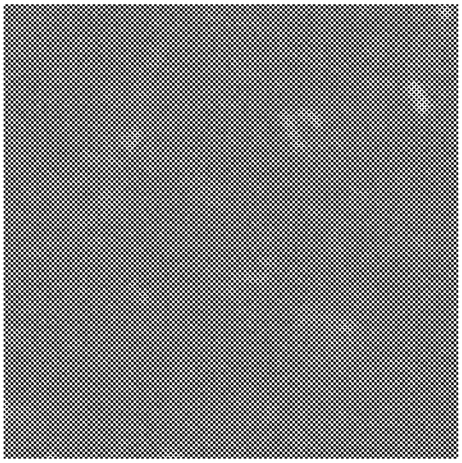

FIGS. 3A to 3C are diagrams illustrating deposition of the high-k dielectric layer 131 according to grain sizes.

Referring to FIGS. 3A to 3C, whether the high-k dielectric layer disposed on the intermediate dielectric layer is uniformly deposited may be determined according to the grain size of the 2D material included in the intermediate dielectric layer.

FIG. 3A is a diagram of the high-k dielectric layer when the grain size of the 2D material included in the intermediate dielectric layer is 300 nm. It is shown that the high-k dielectric layer is not uniformly deposited.

FIG. 3B is a diagram of the high-k dielectric layer when the grain size of the 2D material included in the intermediate dielectric layer is 120 nm.

FIG. 3C is a diagram of the high-k dielectric layer when the grain size of the 2D material included in the intermediate dielectric layer is 40 nm.

When FIGS. 3A, 3B, and 3C are compared, the high-k dielectric layer of FIG. 3C is most evenly and uniformly deposited. Therefore, when the intermediate dielectric layer includes the crystalline material having the grain size of 50 nm or less, the high-k dielectric layer may be most evenly and uniformly deposited.

The intermediate dielectric layer may include an amorphous material.

An amorphous material refers to a phase having a uniform composition, but being in a state where atomic arrangement is disordered, not in a regular lattice form, and may include a material in that phase.

When the intermediate dielectric layer includes the amorphous material, the dielectric material layer may not include grains.

Figure 4:
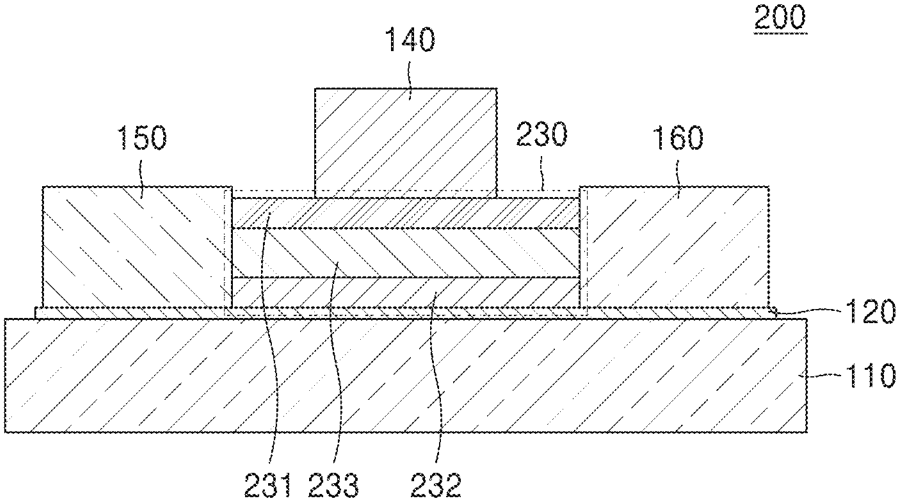
FIG. 4 is a cross-sectional view of a semiconductor device according to another embodiment.

FIG. 4 is a cross-sectional view of a semiconductor device 200 according to another embodiment.

Referring to FIG. 4, the semiconductor device shown in FIG. 1 further includes a ferroelectric layer 233.

Referring to FIG. 4, the channel layer 120 including a 2D semiconductor material is provided on the substrate 110. The 2D semiconductor material may include, for example, TMD, black phosphorous, or graphene. However, one or more embodiments are not limited to the above example. The 2D semiconductor material may have, but is not limited to, a material having a band-gap of about 0.1 eV to about 3.0 eV. The 2D semiconductor material may include, for example, TMD, black phosphorous, or graphene. However, one or more embodiments are not limited to the above example. TMD may include transition metal including, for example, at least one from Mo, W, Nb, Sn, V, Ta, Ti, Zr, Hf, Tc, and Re and a chalcogen element including, for example, at least one from S, Se, and Te.

The 2D semiconductor material in the channel layer 120 may have a single-layered or multi-layered structure. For example, the 2D semiconductor material may have, but is not limited to, one to ten layers (for example, one to five layers). The channel layer 520 may further include a certain dopant such as a p-type dopant or an n-type dopant.

A gate dielectric layer 230 is provided on the channel layer 120, and a gate electrode 140 is provided on the gate dielectric layer 230. The gate dielectric layer 230 may include the high-k dielectric layer 231, an intermediate dielectric layer 232, and the ferroelectric layer 233.

The ferroelectric layer 233 may be disposed between the high-k dielectric layer 231 and the intermediate dielectric layer 232, but is not limited thereto. The ferroelectric layer 233 may be arranged parallel to the high-k dielectric layer or parallel to the intermediate dielectric layer, but is not limited thereto.

The ferroelectric layer 233 may include at least one selected from an oxide ferroelectric material, a polymer ferroelectric material, a fluoride ferroelectric material, but is not limited thereto.

Figure 5:
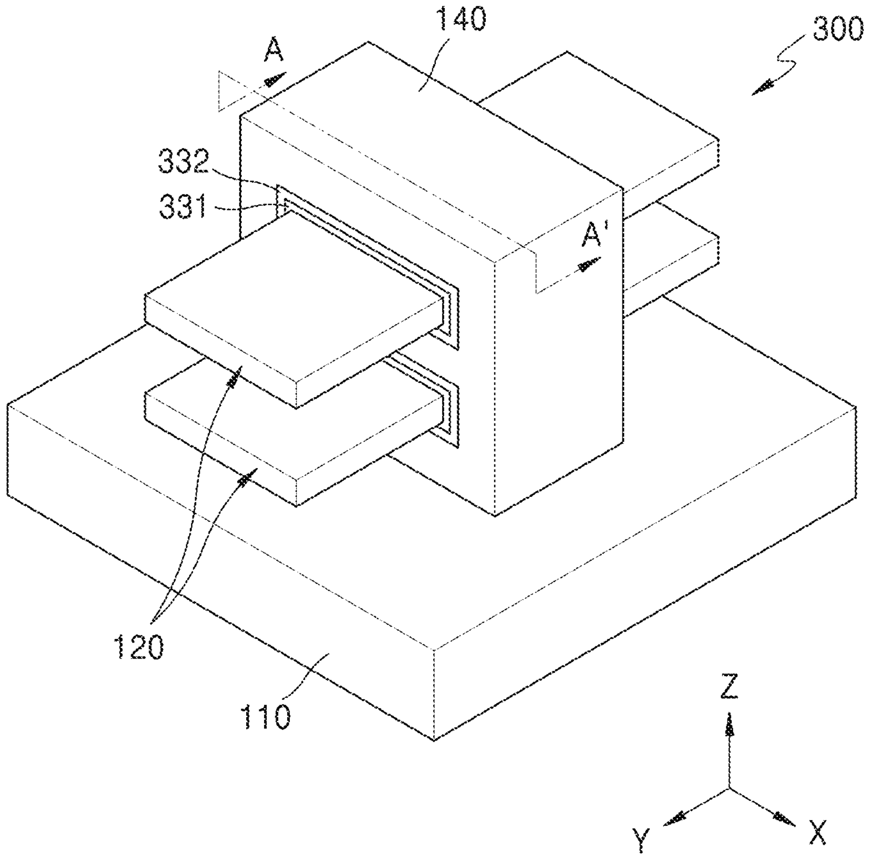
FIG. 5 is a perspective view of a semiconductor device according to another embodiment.

FIG. 5 is a perspective view of a semiconductor device 300 according to another embodiment.

Referring to FIG. 5, the perspective view shows a semiconductor device (MBCFET) 300 according to another embodiment.

As technology has developed, a semiconductor device has developed from a sheet-type to a gate all around (GAA) structure through a fin field effect transistor (FINFET) structure in order to manufacture high-integration transistor. A multi-bridge channel (MBC) FET is a kind of GAA transistor structure and denotes a structure in which a plurality of plate-shaped thin channel layers are vertically stacked. A structure in which four surfaces of the plurality of plate-shaped channel layers are surrounded by the gate electrode is referred to as the MBC FET structure.

Figure 6:
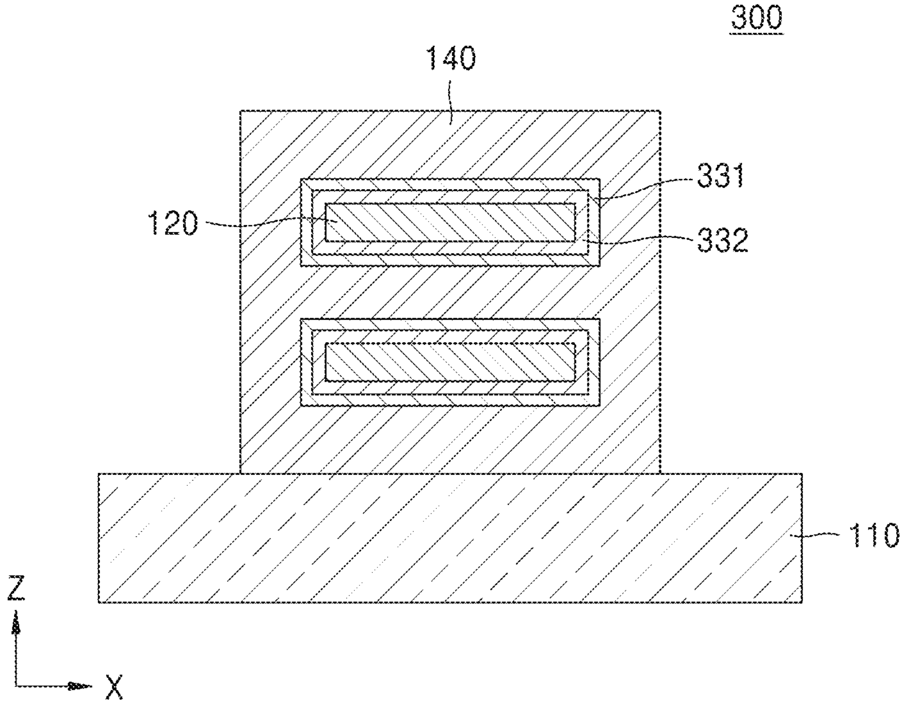
FIG. 6 is a cross-sectional view of the semiconductor device taken along line A-A' of FIG. 5.

FIG. 6 is a cross-sectional view of the semiconductor device taken along line A-A' of FIG. 5.

Referring to FIG. 5 and FIG. 6, at least one channel layer 120 is disposed over the substrate 110 to be spaced apart from the substrate 110. Here, each channel layer 120 may have a sheet shape that is arranged parallel to the substrate 110. In FIGS. 5 and 6, an example in which two channel layers 120 are arranged above and below each other above the substrate 110 is shown.

A gate dielectric layer (not shown) is provided, and the gate electrode 140 is provided on the gate dielectric layer (not shown). Here, the gate dielectric layer (not shown) is provided to surround four surfaces of the channel layers 120, and the gate electrode 140 may be provided to surround four surfaces of the gate dielectric layer (not shown). Although not shown in the drawings, the source and drain electrodes may be provided at left and right sides of the channel layer 120.

Referring to FIG. 6, the gate electrode 140 is disposed on the substrate 110 and surrounds four surfaces of the plurality of channel layers 120 that are arranged in the form of thin plate shapes. The gate dielectric layer (see 331 and 332) is disposed between the channel layer 120 and the gate electrode 140, and the gate dielectric layer may include the high-k dielectric layer 331 and the intermediate dielectric layer 332. Structures and effects of the gate dielectric layer, the high-k dielectric layer, and the intermediate dielectric layer are the same as the above descriptions with reference to FIG. 1.

FIG. 6 shows an MBC-FET structure, but is not limited thereto, and one or more embodiments may include a FinFET structure or a FET including a planar structure.

Figure 7:
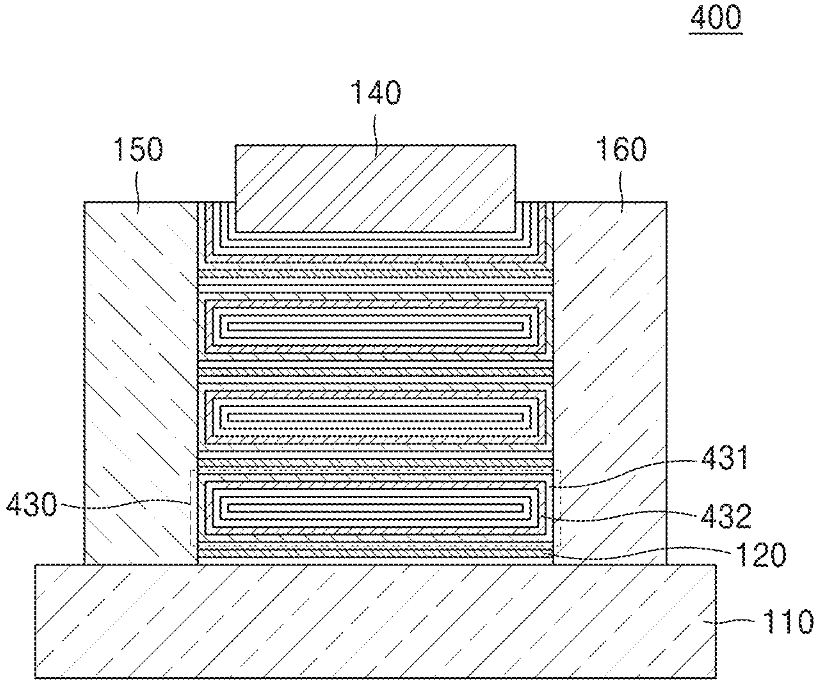
FIG. 7 is a cross-sectional view of a semiconductor device according to another embodiment.

FIG. 7 is a cross-sectional view of a semiconductor device 400 according to another embodiment.

FIG. 7 is a diagram showing the semiconductor device 400 including the substrate 110, the channel layer 120, the gate electrode 140, the source electrode 150, the drain electrode 160, and a gate dielectric layer 430.

The gate dielectric layer 430 may include a high-k dielectric layer 431 and an intermediate dielectric layer 432, and may further include an oxide dipole layer, a TiN barrier layer, and a work function material. However, one or more embodiments are not limited thereto.

Figure 8A:
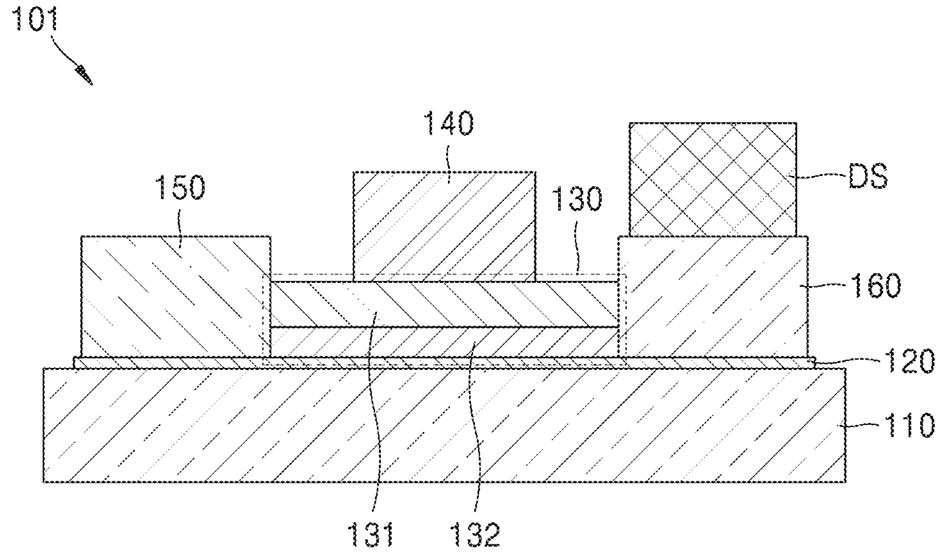
FIGS. 8A to 8C are cross-sectional views of memory devices according to example embodiments.
Figure 8B:
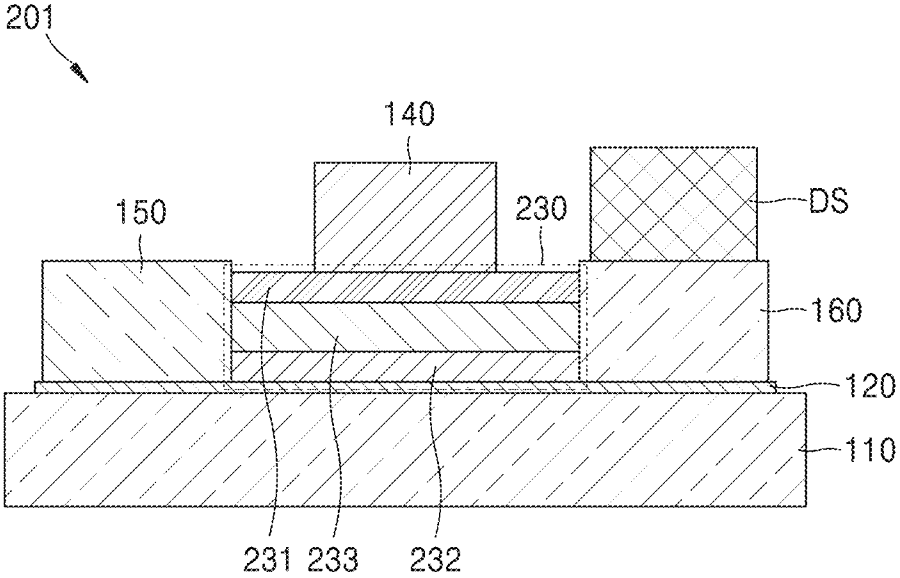
Figure 8C:
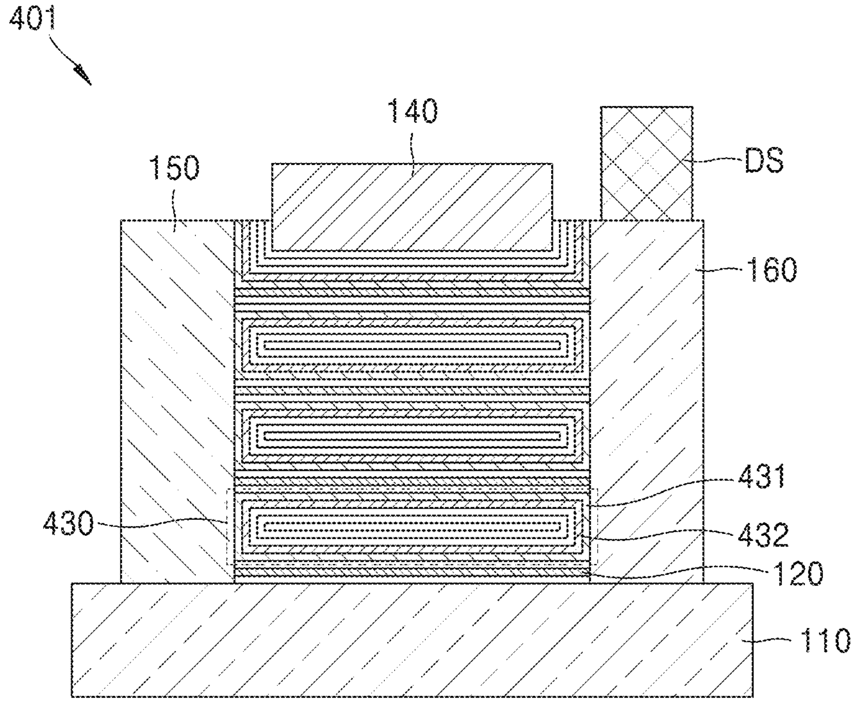

The above-described semiconductor devices 100, 200, 300, and 400 may be applied to a memory device, for example, a DRAM device. The memory device may have a structure in which the semiconductor devices 100, 200, 300, or 400 and a capacitor are electrically connected to each other. For example, FIGS. 8A to 8C are cross-sectional views of memory devices according to example embodiments. Referring to FIGS. 8A, 8B, and 8C, the semiconductor devices 100, 200, and 400 each may further include a data storage DS (e.g., capacitor) on the drain electrode 160 and connected thereto to provide the memory devices 101, 201, and 401 in FIGS. 8A, 8B, and 8C. Also, the semiconductor devices 100, 200, 300, and 400 may be applied to various electronic apparatuses. For example, the semiconductor devices 100, 200, 300, and 400 may be used for arithmetic calculations, program execution, temporary data retention, etc. in an electronic apparatus such as a mobile device, a computer, a laptop computer, a sensor, a network device, a neuromorphic device, etc.

Figure 9:
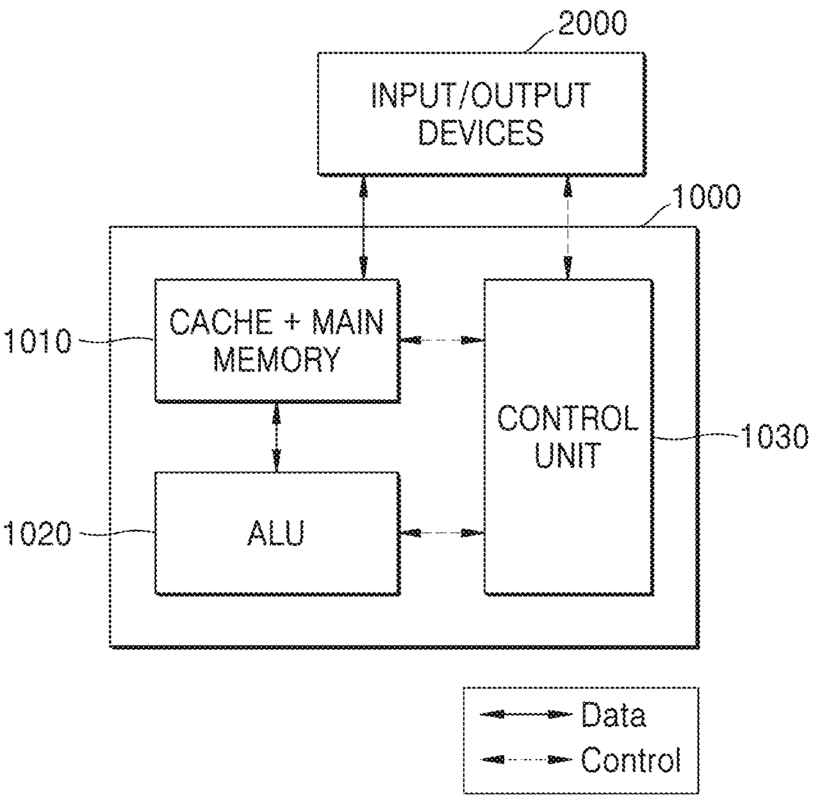
FIGS. 9 and 10 are conceptual diagrams schematically showing device architectures applied to an electronic apparatus and a memory system, according to an embodiment.
Figure 10:
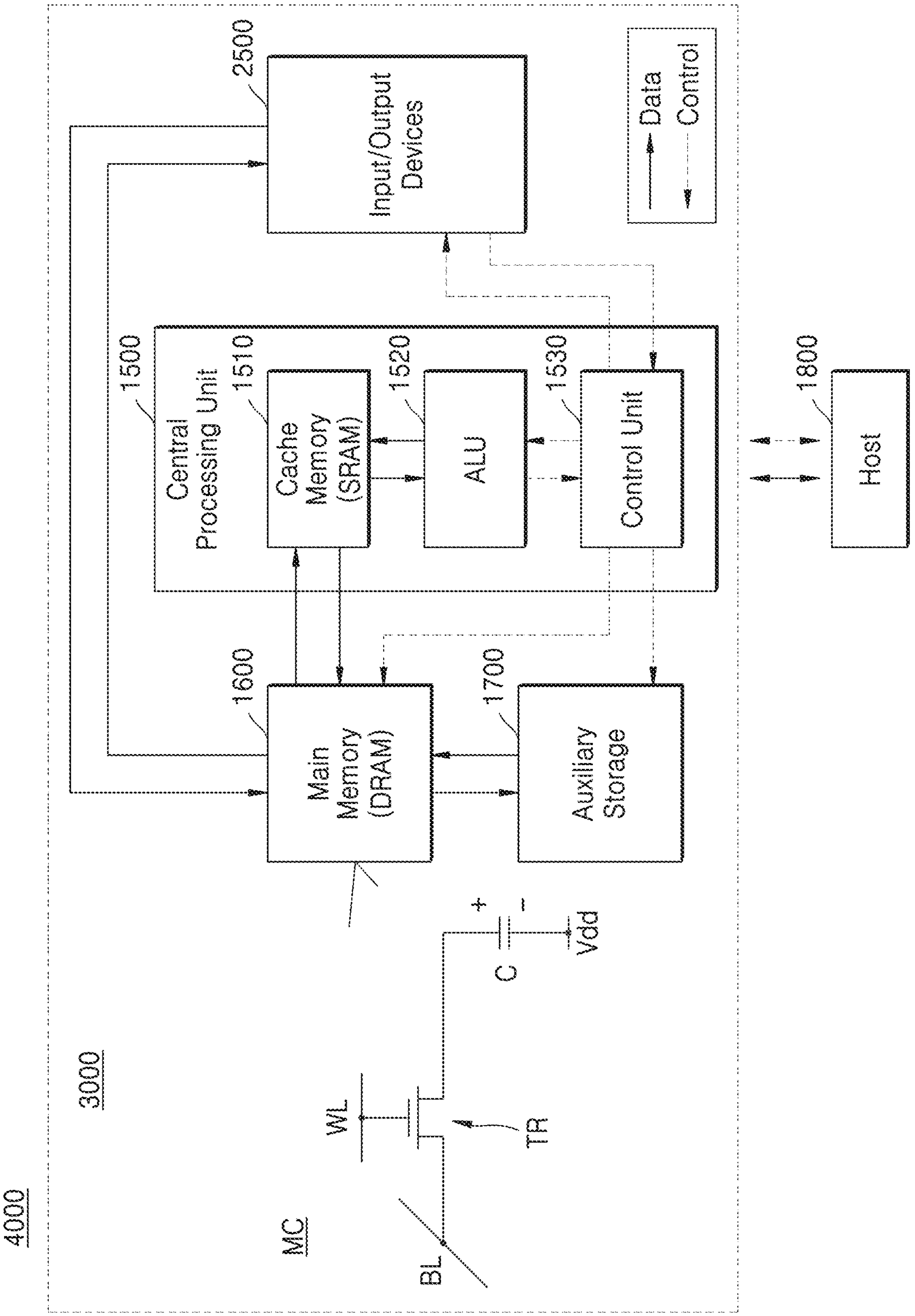

FIGS. 9 and 10 are conceptual diagrams schematically showing electronic device architectures applied to an electronic apparatus and a memory system according to an embodiment.

Referring to FIG. 9, an electronic device architecture 1000 may include a memory unit 1010, an arithmetic logic unit (ALU) 1020, and a control unit 1030. The memory unit 1010, the ALU 1020, and the control unit 1030 may be electrically connected to one another. For example, the electronic device architecture 1000 may be implemented as one chip including the memory unit 1010, the ALU 1020, and the control unit 1030.

In detail, the memory unit 1010, the ALU 1020, and the control unit 1030 may be connected to one another via metal lines on-chip and directly communicate with one another. The memory unit 1010, the ALU 1020, and the control unit 1030 may be monolithically integrated on one substrate and form one chip. An input/output device 2000 (e.g., keyboard, display, mouse) may be connected to the electronic device architecture (chip) 1000.

The ALU 1020 and the control unit 1030 may independently include the semiconductor devices 100-400 described above, and the memory unit 1010 may include the semiconductor devices 100, 200, 300, and 400, a capacitor, or combinations thereof (e.g., memory devices 101, 201, 401). The memory unit 1010 may include a main memory and a cache memory. The electronic device architecture (chip) 1000 may be an on-chip memory processing unit.

Referring to FIG. 10, a memory system 4000 may include an electronic device 3000. The electronic device 3000 may include a cache memory 1510, an ALU 1520, and a control unit 1530, which may form a central processing unit (CPU) 1500. The cache memory 1510 may include a static random-access memory (SRAM), and may include the semiconductor devices 100, 200, 300, and 400, a capacitor, or combinations thereof (e.g., memory devices 101, 201, 401). Separately from the CPU 1500, a main memory 1600 and an auxiliary storage 1700 may be provided. The main memory 1600 may include a dynamic random-access memory (DRAM) device. One or more input/output device 2500 (e.g., keyboard, display, mouse) may be connected to the main memory 1600, auxiliary storage 1700, and/or CPU 1500.

In some cases, the electronic device architecture may be implemented in a form in which computing unit devices and memory unit devices are adjacent to each other in one chip, without distinction of sub-units. Although the embodiments have been described above, these are merely an example, and various modifications may be made therefrom by those of ordinary skill in the art.

The semiconductor device according to the embodiment includes the channel layer including the 2D semiconductor material, the gate dielectric layer provided in the first area of the channel layer, the gate electrode provided on the gate dielectric layer, and the source and drain electrodes provided in the second area of the channel layer, and the gate dielectric layer includes the high-k dielectric layer, and the intermediate dielectric layer provided between the high-k dielectric layer and the channel layer and having a less dielectric constant than that of the high-k dielectric layer. The intermediate dielectric layer provided between the high-k dielectric layer and the channel layer may limit and/or prevent the remote phonon scattering effect and the reduction in the channel mobility, and because the grain size of the 2D material in the intermediate dielectric layer is less than the grain side of the 2D semiconductor material in the channel layer, the uniform deposition of the high-k dielectric layer may be carried out.

The CPU 1500 may read and write data from and into the main memory 1600 in response to read and write requests of a host 1800. The CPU 1500 may make an address mapping table for mapping an address provided from the host 1800 (e.g., a mobile device or a computer system) into a physical address of the main memory 1600. The main memory 1600 may include a plurality of memory cells MC. Each of the memory cells MC and include a data storage (e.g., capacitor C) connected to a transistor TR and may have a structure including any one of the semiconductor devices 100, 200, 300, and 400, and/or memory devices 101, 201, and 401. The transistor TR may be provided at an intersection between a bit line BL and word line WL.

However, effects of the present disclosure are not limited to the above disclosure.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:

a channel layer including a two-dimensional (2D) semiconductor material;

a gate dielectric layer on a first area of the channel layer;

a gate electrode on the gate dielectric layer; and
a source electrode and a drain electrode in a second area of the channel layer, wherein
the gate dielectric layer includes a high-k dielectric layer and an intermediate dielectric layer,
the intermediate dielectric layer is between the high-k dielectric layer and the channel layer, and
a dielectric constant of the intermediate dielectric layer is less than a dielectric constant of the high-k dielectric layer,
wherein the 2D semiconductor material includes transition metal dichalcogenide (TMD),
the TMD includes a metal element and a chalcogen element, the metal element includes one of Mo, W, Nb, Sn, V, Ta, Ti, Zr, Hf, Tc, and Re, and the chalcogen element includes one of S, Se, and Te,
wherein a thickness of the intermediate dielectric layer is about 0.5 nm to about 2 nm, and
wherein the intermediate dielectric layer includes a crystalline material having a grain size of 50 nm or less.

2. The semiconductor device of claim 1, wherein
the intermediate dielectric layer includes a material having a dielectric constant of 9 or less.

3. The semiconductor device of claim 1, wherein
the intermediate dielectric layer includes at least one of C, Si, B, N, O, and Al.

4. The semiconductor device of claim 1, wherein
the intermediate dielectric layer includes a crystalline material.

5. The semiconductor device of claim 1, wherein
the intermediate dielectric layer includes grains having smaller sizes than grains of the 2D semiconductor material of the channel layer.

6. The semiconductor device of claim 1, wherein
the intermediate dielectric layer includes an amorphous material.

7. The semiconductor device of claim 1, wherein
the intermediate dielectric layer includes a 2D material.

8. The semiconductor device of claim 1, wherein
the 2D semiconductor material of the channel layer includes one to ten layers.

9. The semiconductor device of claim 8, wherein
the 2D semiconductor material of the channel layer includes one to five layers.

10. The semiconductor device of claim 1, wherein
the 2D semiconductor material of the channel layer includes a material having a bandgap of about 0.1 eV to about 3.0 eV.

11. The semiconductor device of claim 1, wherein
the TMD includes at least one of $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and $SnTe_2$.

12. The semiconductor device of claim 1, further comprising
a ferroelectric layer between the high-k dielectric layer and the intermediate dielectric layer.

13. The semiconductor device of claim 12, wherein
the ferroelectric layer includes at least one of an oxide ferroelectric material, a polymer ferroelectric material, and a fluoride ferroelectric material.

14. The semiconductor device of claim 1, wherein
the gate electrode includes metal, conductive nitride, or conductive oxide.

15. The semiconductor device of claim 1, wherein
the source electrode and the drain electrode include a metal material.

16. An electronic apparatus comprising the semiconductor device according to claim 1.

* * * * *